(12) United States Patent
Han

(10) Patent No.: US 6,611,452 B1
(45) Date of Patent: Aug. 26, 2003

(54) REFERENCE CELLS FOR TCCT BASED MEMORY CELLS

(75) Inventor: Jin-Man Han, Santa Clara, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/117,930

(22) Filed: Apr. 5, 2002

(51) Int. Cl.[7] ............................................. G11C 11/00
(52) U.S. Cl. ........................................ 365/159; 71/72
(58) Field of Search .......................... 365/159, 71, 72, 365/175, 148, 149

(56) References Cited

U.S. PATENT DOCUMENTS 5,953,249 A * 9/1999 van der Wagt ............. 365/175
6,229,161 B1   5/2001 Nemati et al.
6,512,690 B1 * 1/2003 Qi et al. ..................... 365/171
2002/0054502 A1 * 5/2002 King ........................... 365/148

OTHER PUBLICATIONS

Hirano, H., et al., 2V/100–ns 1T/1C Nonvolatile Ferroelectric Memory Architecture with Bitline–Driven Read Scheme and Nonrelaxation Reference Cell, IEEE Journal of Solid––State Circuits, 1997, pp. 649–654, vol. 32, No. 5.

* cited by examiner

Primary Examiner—David Lam

(57) ABSTRACT

A reference cell produces a voltage rise on a bit line that is proportional to, and preferably half of, the voltage rise on another bit line produced by a TCCT based memory cell in an "on" state. The reference cell includes an NDR device, a gate-like device disposed adjacent to the NDR device, a first resistive element coupled between the NDR device and the bit line, and a second resistive element coupled between a sink and the bit line. Resistances of the first and second resistive elements are about equal and about twice as much as the resistance of a pass transistor of the a TCCT based memory cell.

39 Claims, 6 Drawing Sheets

REFERENCE CELLS FOR TCCT BASED MEMORY CELLS

BACKGROUND OF THE INVENTION

1. Field of the Invention

The present invention relates generally to the field of semiconductor capacitively coupled negative differential resistance ("NDR") devices for data storage, and more particularly to reference cells to be used therewith.

2. Description of the Prior Art

U.S. Pat. No. 6,229,161 issued to Nemati et al., incorporated herein by reference in its entirety, discloses capacitively coupled NDR devices for use as SRAM memory cells. The cells disclosed by Nemati et al. are hereinafter referred to as thinly capacitively coupled thyristor ("TCCT") based memory cells. FIG. 1 shows a pair of representative TCCT based memory cells 10 as disclosed by Nemati et al., and FIG. 2 shows a cross-section through one of the pairs of TCCT based memory cell 10 along the line 2—2. FIG. 3 shows a schematic circuit diagram corresponding to the TCCT based memory cell illustrated in FIGS. 1 and 2. The TCCT based memory cell 10 includes an NDR device 12 and a pass transistor 14. A charge-plate or gate-like device 16 is disposed adjacent to, and in the case of the illustrated embodiment, surrounding, the NDR device 12. A P+ region 18 of the NDR device 12 is connected to a metallization layer 20 so that a first voltage $V_1$, such as $V_{dd}$, can be applied to the NDR device 12 through the P+ region 18. An N+ region of the NDR device 12 forms a storage node 22 that is connected to a source of the pass transistor 14.

Successive TCCT based memory cells 10 are joined by three lines, a bit line 26, a first word line (WL1) 28, and a second word line (WL2) 30. The bit line 26 connects a drain 32 of pass transistor 14 to successive TCCT based memory cells 10. In a similar fashion, pass transistor 14 includes a gate 34 that forms a portion of the first word line 28. Likewise, the gate-like device 16 forms a portion of the second word line 30.

TCCT based memory cell 10 has both an "on" state and an "off" state. In the "on" state TCCT based memory cell 10 generates a current that is received by bit line 26. In the "off" state TCCT based memory cell 10 produces essentially no current. Second word line 30 is enabled to write a state to the TCCT based memory cell 10, while first word line 28 is enabled to read the state of the TCCT based memory cell 10.

FIG. 4 shows a representation of the voltage change on the first word line 28 during a read operation and the corresponding voltage change on the bit line 26. FIG. 4 illustrates that although the voltage on the first word line 28 (i.e., when pass gate 14 is enabled) rises rapidly to close the circuit at the pass transistor 14 to allow current from the NDR device 12 to reach the bit line 26, the voltage on the bit line 26 rises from ground much more gradually. More specifically, the bit line 26 has a capacitance, C, that is charged as current from the NDR device 12 begins to flow, and the pass transistor 14 has a resistance, R. Therefore, an RC time constant governs how quickly the bit line voltage can rise.

FIG. 5 shows a schematic circuit diagram of an exemplary reference cell 50 of the prior art. The reference cell 50 includes a pass transistor 52 coupled between an NDR device 54 and a bit line 56, and a charge-plate or gate-like device 58 disposed adjacent to the NDR device 54. The anode end 60 of the NDR device 54 and the gate-like device 58 are both coupled to a first voltage source 60 so that the NDR device 54 is continuously in the "on" state. The pass transistor 52 includes a gate 62 coupled to a first word line 64. The pass transistor 14 (FIG. 3) has both a channel length, L, and a channel width, W, where L is the spacing between the source and the drain, and W is the width of the pass transistor 14 in the direction perpendicular to the page of the drawing in FIG. 2. Similarly, the pass transistor 52 also has a channel length, L, and a width, W. The ratio W/L for the pass transistor 52 is about half of the W/L ratio for the pass transistor 14. This is typically accomplished by producing a pass transistor 52 with about twice the length L of the pass transistor 14. Accordingly, reference cell 50 produces a reference current that is approximately half of the current produced by TCCT based memory cell 10 in the "on" state.

FIG. 6 shows a comparison between the voltage on the bit line 26 (FIG. 3) and the bit line 56 (FIG. 5) as a function of time after their respective cells 10, 50 have been activated. It can be seen that although the current output from the reference cell 50 is less than that from the TCCT based memory cell 10, the voltages on the two bit lines 26, 56 eventually approach the same value. Accordingly, in the event that the TCCT based memory cell 10 is in the "on" state and is selected to be read from, a sense amplifier comparing the voltages on bit line 26 (FIG. 3) and bit line 56 (FIG. 5) as a function of time will observe a difference ($\Delta_1$) that initially increases, reaches a maximum ($\Delta_{MAX}$), and then diminishes again ($\Delta_2$).

FIG. 6 does not include a curve to represent the voltage on the bit line 26 (FIG. 3) when the TCCT based memory cell is in the "off" state, as the voltage increase is negligible. It will nevertheless be appreciated that if the TCCT based memory cell 10 is in the "off" state, a sense amplifier comparing the voltages on bit line 26 (FIG. 3) and bit line 56 (FIG. 5) as a function of time will observe a difference that simply increases to a maximum since the voltage on bit line 26 is negligible. The problem for a sense amplifier trying to differentiate between the two states of a TCCT based memory cell 10 is that in both instances the difference between the two input voltages begins by increasing. Only be waiting a sufficient time does it become apparent whether the difference dissipates to indicate the "on" state or does not dissipate to indicate the "off" state.

What is desired, therefore, is a reference cell for use with a TCCT based memory cell that can produce a voltage on a bit line such that a difference between the voltage and another voltage produced by the TCCT based memory cell on another bit line readily indicates a state of the TCCT based memory cell. It is further desired that the reference cell produce a voltage that rises at a rate that is proportional to the rate of increase of the voltage produced by the TCCT based memory cell to provide for fast and reliable sensing. It is also desired that the rate of increase for the reference cell be approximately half that for the TCCT based memory cell in the "on" state.

SUMMARY

A reference cell for a TCCT based memory cell includes an NDR device, a gate-like device disposed adjacent to the NDR device, a first resistive element coupled between the NDR device and a bit line and having a first resistance, and a second resistive element coupled between a current sink and the bit line and having a second resistance that is preferably about equal to the first resistance. In preferred embodiments the resistive elements are transistors and the gates of the transistors are both coupled to a first word line.

In additional embodiments a second word line connects an anode of the NDR device and the gate-like device.

It can be seen that the reference cell of the invention is significantly like a TCCT based memory cell with the addition of the second resistive element, sometimes referred to as a pull-down resistor, between the current sink and the bit line. The addition of the second resistive element is advantageous because it allows for a reference cell that can produce a voltage increase on the bit line that rises proportionally to a voltage increase caused by a TCCT based memory cell.

A memory device of the invention includes a TCCT based memory cell and a reference cell. The TCCT based memory cell is configured to generate a first voltage on a first bit line and the reference cell is configured to generate a second voltage on a second bit line. The TCCT based memory cell includes a switching device, typically a pass transistor, having a first resistance. The reference cell includes first and second resistive elements, as described above. In some embodiments the resistances of the first and second resistive elements are about equal and about twice the first resistance. Other embodiments further include means for comparing the first and second voltages, for example, a sense amplifier.

The invention also includes a memory array including a plurality of TCCT based memory cells, at least one reference cell and a plurality of bit lines. The array can also include a sense amplifier to compare the voltages produced by the TCCT based memory cells and the reference cell. In embodiments of the invention the plurality of bit lines are arranged in parallel rows and each bit line has a number of the plurality of TCCT based memory cells attached thereto. The plurality of TCCT based memory cells may therefore be arranged as a matrix with one bit line per row. The reference cell in the memory array can be on a dedicated bit line, or several reference cells can be distributed around the array. In those embodiments in which reference cells and TCCT based memory cells share common bit lines, the array also includes a controller (not shown) containing logic required to select individual TCCT based memory cells and to select a reference cell on a different bit line.

BRIEF DESCRIPTION OF DRAWINGS

The present invention is illustrated by way of example, and not by way of limitation, in the figures of the accompanying drawings where like reference numerals frequently refer to similar elements and in which.

DETAILED DESCRIPTION OF THE INVENTION

Figure 7:
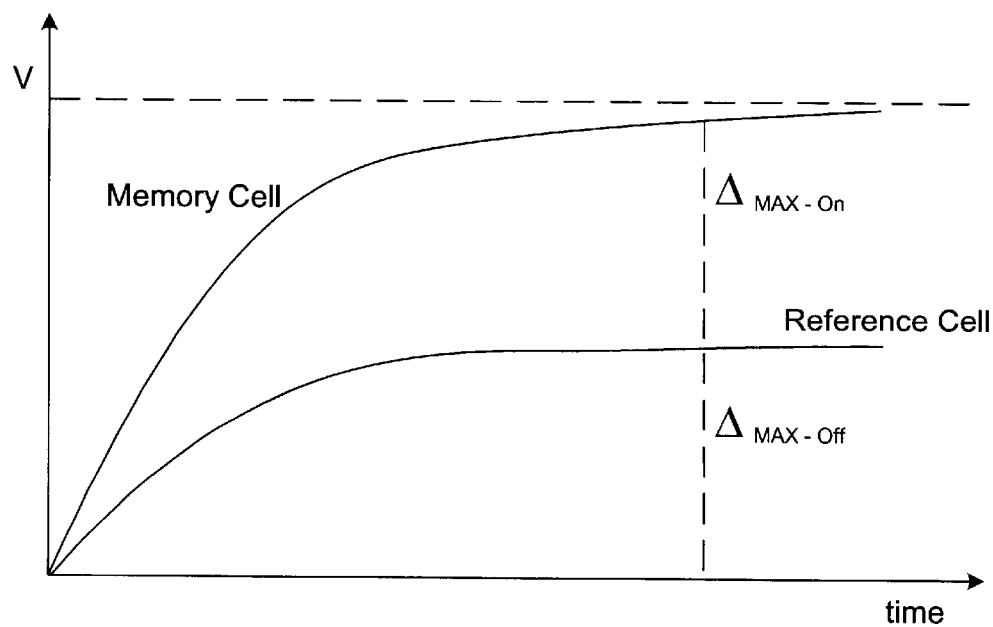
FIG. 7 shows the voltage rise profile achieved by an exemplary reference cell in accordance to one embodiment of the invention compared to the profile generated by a TCCT based memory cell in an "on" state.
Figure 8:
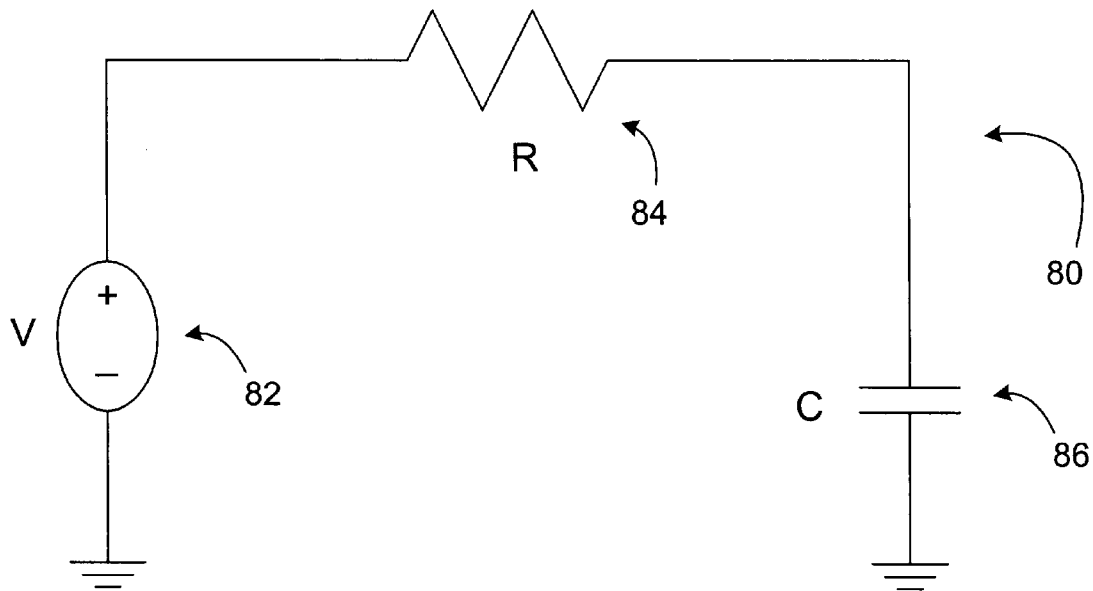
FIG. 8 is a simple RC model of the TCCT based memory cell of FIG. 1.

FIG. 7 shows the desired voltage rise profile achieved by one embodiment of the invention compared to the profile generated by a TCCT based memory cell in an "on" state which corresponds to a logical state of either 1 or 0. It can be seen that the voltage rise for the reference cell is proportional to that for the TCCT based memory cell. In preferred embodiments the voltage rise for the reference cell is proportional to the voltage rise for the TCCT based memory cell. In one embodiment, the reference cell voltage rises at about half the rate of the TCCT based memory cell voltage. FIG. 8 provides a simple RC model 80 of a TCCT based memory cell. The model 80 includes a voltage source 82 to represent the voltage produced by an NDR device, a resistor 84 to represent the resistance of an access or "pass" transistor, and a capacitor 86 to represent the capacitance of a bit line. In model 80 the output resistance of the NDR device is considered to be negligible compared to the resistance of resistor 84. One can readily derive an equation (1), below, to describe the behavior of model 80 where the voltage, v1(t), rises on the bit line as a function of time, t:

$$V1(t)=V(1-e^{-t/RC}) \quad (1)$$

Another voltage, v2(t), having the profile shown for the reference cell of FIG. 7, is therefore described by an equation (2), below, that differs from equation (1) only by a proportionality constant, m. The proportionality constant, m, represents the proportional relationship between the two curves shown in FIG. 7. An exemplary proportionality constant is designed to be ½ so that at any given time the voltage of the reference cell is half as much as the voltage of the TCCT based memory cell in the "on" state.

$$V2(t)=mV(1-e^{-t/RC}) \quad (2)$$

Figure 9:
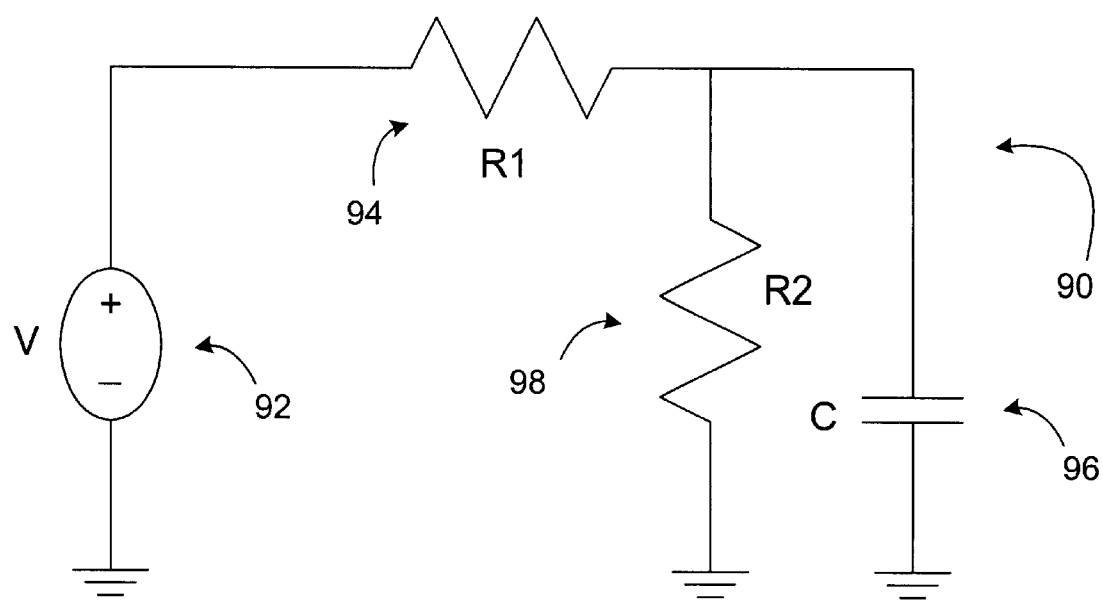
FIG. 9 is a simple RC model of a reference cell of the invention.

As shown in FIG. 9, an exemplary TCCT based reference cell of the invention can therefore be modeled as an RC circuit 90 that includes a voltage source 92 to represent the voltage produced by an NDR device, a first resistor 94 to represent the resistance R1 of an access transistor, a capacitor 96 to represent the capacitance of a bit line, and a second resistor 98 to add a resistance R2 in parallel to the capacitor 96. A general equation (3), below, for the voltage rise on a bit line can be derived from the RC circuit 90.

$$V2(t)=V[R2/(R1+R2)](1-e^{-t(R1+R2)/(R1R2C)}) \quad (3)$$

When the resistances R1 and R2 are equal to twice the resistance of resistor 84 (FIG. 8) then RC circuit 90 will produce a voltage as described by equation (2) with a proportionality constant of ½. Other proportionality constants can also be obtained from equation (3). For example, a proportionality constant of $$\frac{1}{3}$$

can be obtained by setting R1 equal to 3 times the resistance of resistor 84 and R2 equal to 1.5 times the resistance of resistor 84.

Figure 10:
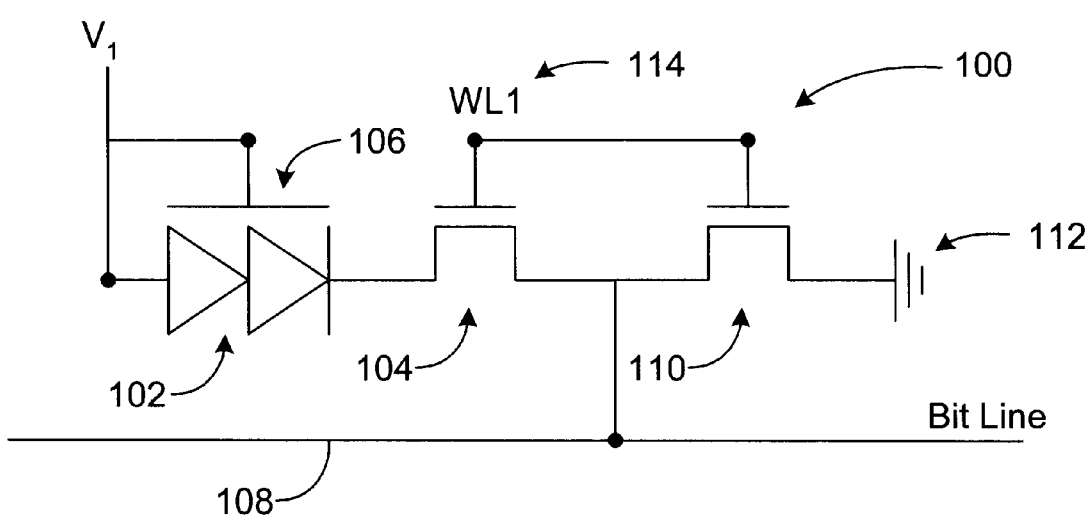
FIG. 10 shows an example of a reference cell according to an embodiment of the invention.

FIG. 10 shows an embodiment of a reference cell 100 of the invention that fits the model described by RC circuit 90.

Figure 3:
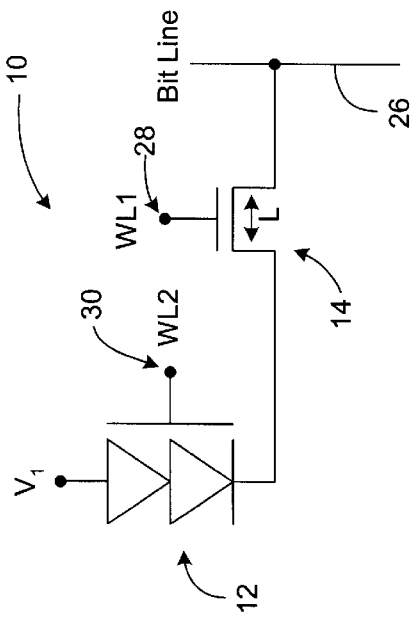
FIG. 3 shows a schematic circuit diagram of the TCCT based memory cell of FIG. 1.
Figure 1:
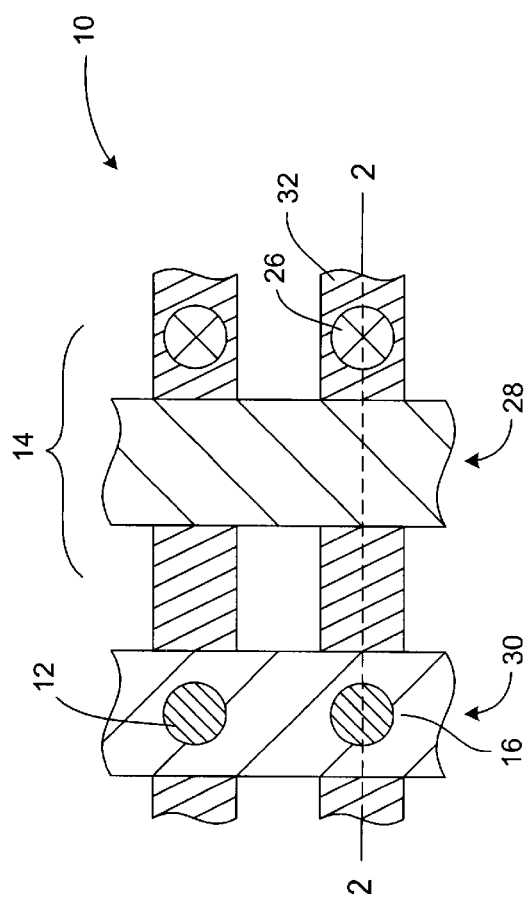
FIG. 1 shows a TCCT based memory cell of the prior art.
Figure 2:
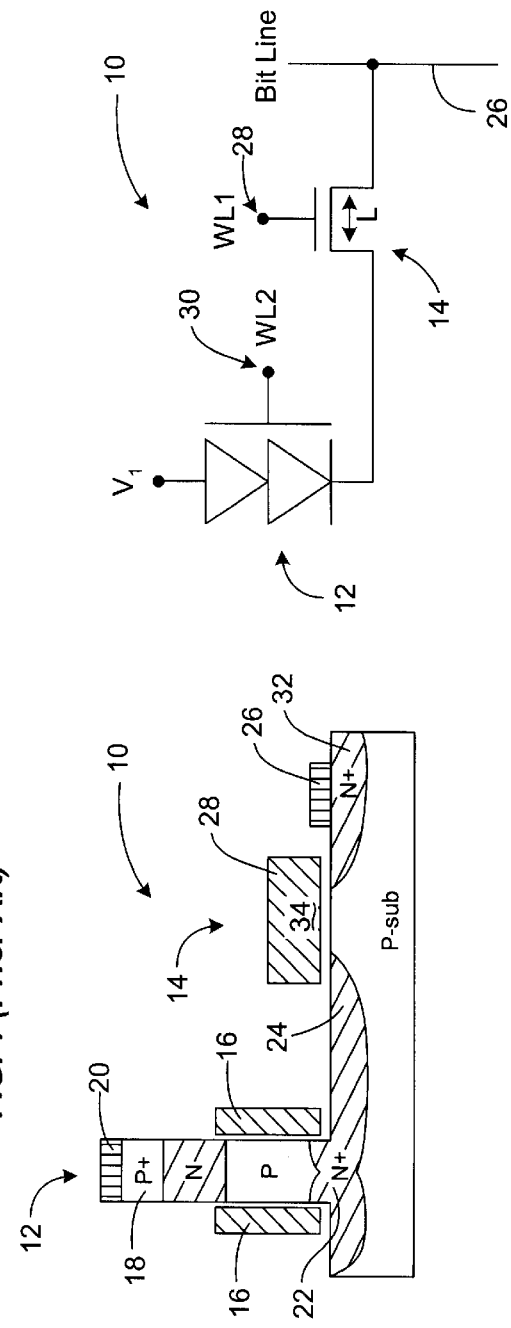
FIG. 2 shows a cross-section of the TCCT based memory cell of FIG. 1.

Reference cell 100 includes an NDR device 102, a pass transistor 104, and a charge-plate or gate-like device 106 disposed adjacent to the NDR device 102. A source of the pass transistor 104 is connected to a bit line 108. Reference cell 100 further includes a resistive element (corresponding to R2 in FIG. 9) such as pull down transistor 110 connected between the bit line 108 and sink 112 to clamp the bit line 108 so that it does not reach the same voltage as that reached on bit line 26 (FIG. 3). It is noted that sink 112 is at a voltage other than that of $V_{dd}$ and is preferably biased to ground but does not need to be. In those embodiments in which sink 112 is biased to a low voltage above or below ground, the bit line 108 also should be biased to the same low voltage.

Each of the pass transistor 104 and the pull down transistor 110 have a channel length, L, and a width, W, as described with reference to FIG. 3. In some embodiments, each of the pass transistor 104 and the pull down transistor 110 have a W/L ratio that is about half of the W/L ratio for pass transistor 14 (FIG. 3). Creating half of the W/L ratio is achieved in some of these embodiments by using the same width, W, in combination with twice the channel length, 2L.

One end of the NDR device 102 is connected to the gate-like device 106 so that both are configured to receive a first voltage $V_1$, while a second end of the NDR device 102 is connected to the drain of the pass transistor 104. Since $V_1$ is applied to both the NDR device 102 and the gate-like device 106 the NDR device 102 is always in the "on" state. A word line 114 connects the gates of the pass transistor 104 and the pull down transistor 110. When the same voltage is applied to word line 114 as is applied to first word line 28 (FIG. 3), and the pass transistor 104 and the pull down transistor 110 each have the W/L ratio that is about half of the W/L ratio for pass transistor 14, then the pass transistor 104 and the pull down transistor 110 will each have a resistance about twice that of the pass transistor 14. Consequently, the voltage developed on the bit line 108 follows the relationship shown in FIG. 7.

Other embodiments of the invention are readily envisioned. For example, either or both of the pass transistor 104 and the pull down transistor 110 can be replaced with two other transistors connected in series, where each of the new transistors has a channel length, L, equal to that of the pass transistor 14. Additionally, the invention does not require that the pass transistor 104 and the pull down transistor 110 share a common word line. Instead, the pass transistor 104 and the pull down transistor 110 can have different widths, channel lengths, and can be operated at different voltages. It should also be noted that the invention is not limited to TCCT based memory cells, though it is primarily described with reference thereto. It will be understood that other types of memory cells, for example SRAM cells, MRAM cells, and memory cells with floating gates such as flash memory cells, also represent different logical states with high and low voltage outputs. Any of these memory cells, when configured to be permanently in a high voltage state, can be readily substituted for the NDR device 102 in FIG. 10.

Figure 4:
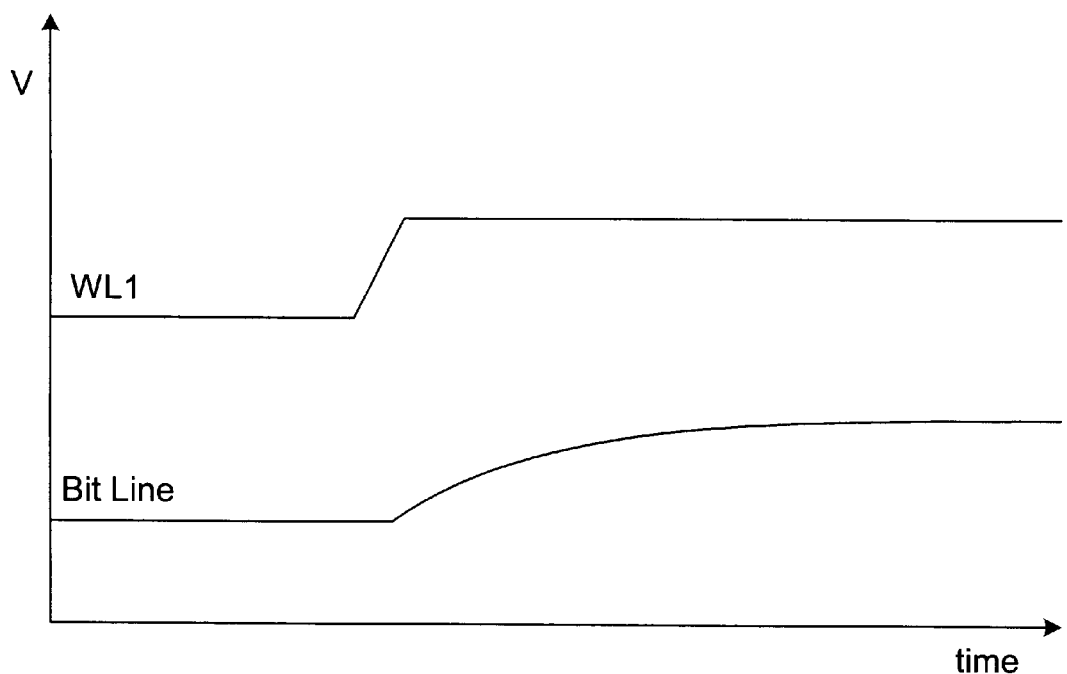
FIG. 4 shows the voltage change on a word line and the corresponding voltage change on a bit line.
Figure 5:
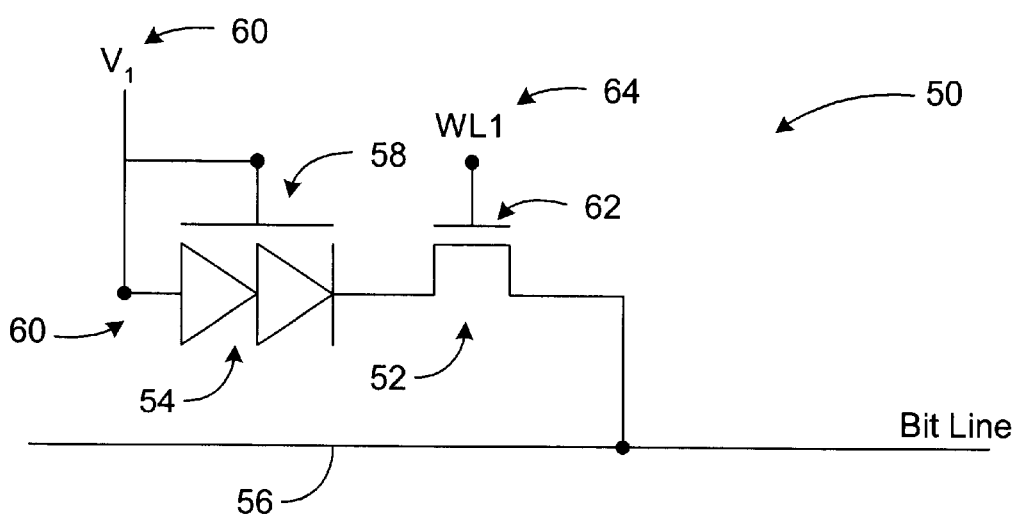
FIG. 5 shows a schematic circuit diagram of a reference cell of the prior art.
Figure 6:
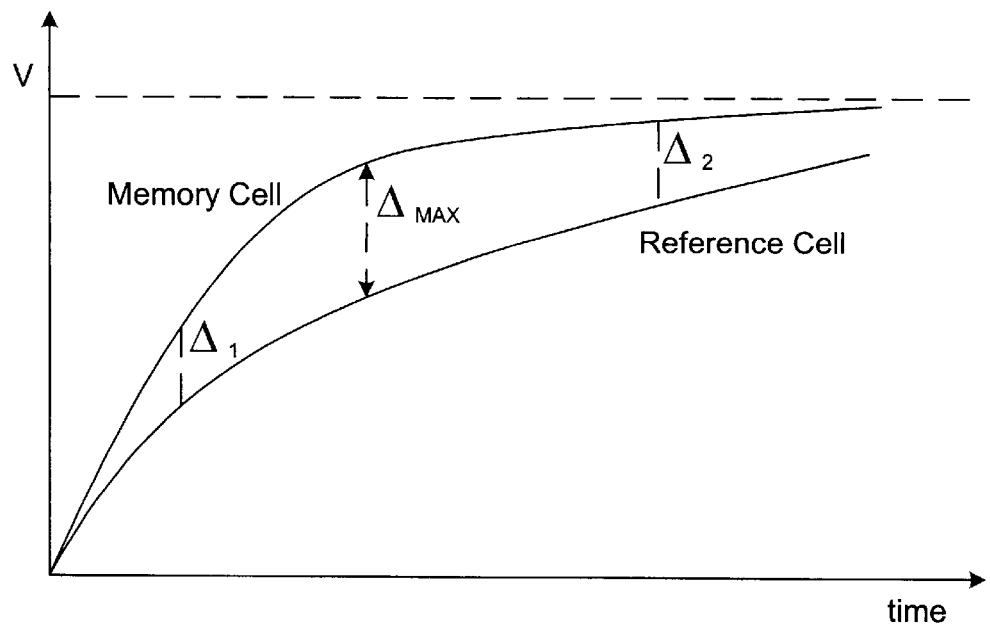
FIG. 6 is a comparison between voltages on bit lines connected, respectively, to the TCCT based memory cell of FIG. 1 and the reference cell of FIG. 5.
Figure 11:
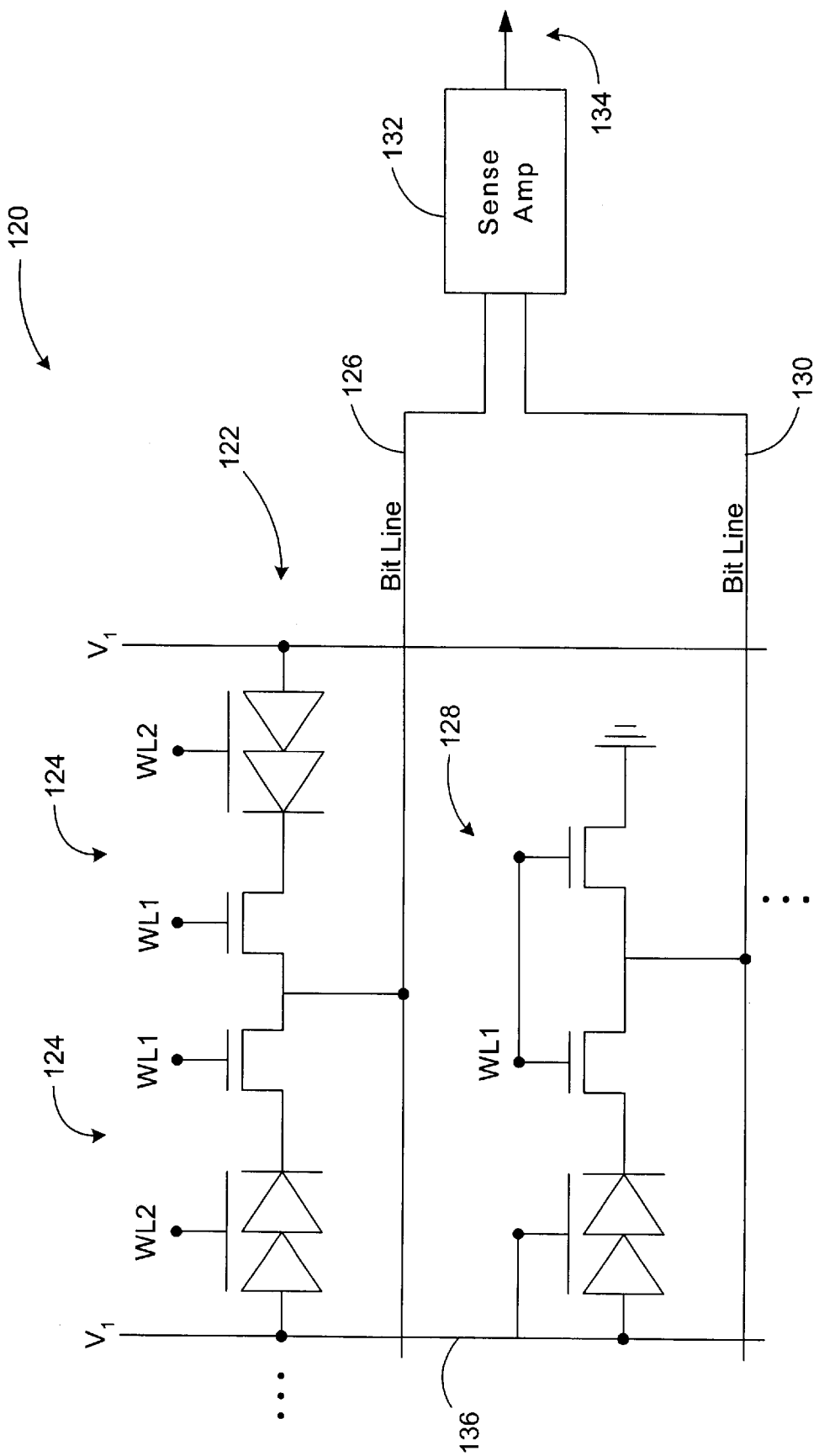
FIG. 11 shows an example of a memory array of the invention using an exemplary reference cell.

FIG. 11 shows an embodiment of a memory array 120 of the invention. The memory array 120 includes a row 122 of TCCT based memory cells 124 of which only two are shown. Each TCCT based memory cell 124 of row 122 is connected to a first bit line 126. The memory array 120 further includes a reference cell 128 connected to a second bit line 130. Both bit lines 126 and 130 are connected to a sense amplifier 132. In operation, one TCCT based memory cell 124 is selected to be read by activating the pass transistor of that cell, while at the same time the reference cell 128 is also activated. Accordingly, a first voltage is produced on the first bit line that rises as a function of time according to equation (1) and the corresponding curve in FIG. 4. A second voltage is simultaneously produced on the second bit line that rises as a function of time according to equation (2) and the corresponding curve in FIG. 7.

If the TCCT based memory cell 124 is in the "on" state when read, then the voltage rise on the first bit line 126 will be proportionally larger than the voltage rise on the second bit line 130. In preferred embodiments the voltage rise on the first bit line 126 will be twice as great as the voltage rise on the second bit line 130. In the alternative, if the TCCT based memory cell 124 is in the "off" state when read, then the voltage rise on the first bit line 126 will be insignificant compared to the voltage rise on the second bit line 130. It should be noted, however, that although the voltage rise on the first bit line 126 will be insignificant, whatever rise does occur will still approximately follow equation (1) and the corresponding curve in FIG. 4.

When the TCCT based memory cell 124 is in the "on" state when read, the sense amplifier 132 detects a first voltage on the first bit line 126 that is proportionally greater than the voltage on the second bit line 130, and as time progresses a voltage difference between the first and second voltages rapidly approaches a maximum. On the other hand, when the TCCT based memory cell 124 is in the "off" state when read, the sense amplifier 132 detects a first voltage on the first bit line 126 that is significantly less than the voltage on the second bit line 130, and as time progresses a voltage difference between the first and second voltages again rapidly approaches another maximum. In embodiments where the proportionality constant, m, in equation (2) is ½, the maximum voltage difference seen when the TCCT based memory cell 124 is in the "off" state, $\Delta_{MAX-Off}$, will have nearly the same magnitude but an opposite polarity as the maximum achieved when the TCCT based memory cell 124 is in the "on" state, $\Delta_{MAX-On}$ (see FIG. 7). In other words, $\Delta_{MAX-Off} = -\Delta_{MAX-On}$. Therefore, sense amplifier 132 can differentiate between the "on" and "off" states of a TCCT based memory cell 124 by the polarity of the voltage difference developed between the two bit lines 126 and 130. It is important to note that the polarity of the voltage difference will become apparent well before the maximum voltage difference is attained, and therefore the state of the TCCT based cell can be rapidly determined. Once the sense amplifier 132 determines the state of the TCCT based memory cell 124, the sense amplifier 132 produces a corresponding signal as an output 134.

Although FIG. 11 only shows a single row 122 of TCCT based memory cells 124, alternate embodiments of the invention can include a plurality of bit lines 126 arranged, for instance, in parallel rows. A memory array 120 can therefore include a large number of TCCT based memory cells 124 arranged as a matrix with one bit line 126 per row 122. The reference cell 128 in the memory array 120 can be on a dedicated bit line 130, or several reference cells 128 can be distributed around the memory array 120 such that at least some bit lines are common to both TCCT based memory cells 124 and reference cells 128. In those embodiments in which reference cells 128 and TCCT based memory cells 124 share common bit lines, the memory array 120 also includes a controller (not shown) containing logic required to select an individual TCCT based memory cell 124 and to select a reference cell 128 on a different common bit line.

It should be noted that additional embodiments of the invention are directed to a memory device. A memory device is essentially the pairing of a TCCT based memory cell 124 and a reference cell 128, though the concept of a memory device is not strictly limited to a one to one pairing. It is noted, however, that with a single TCCT based memory cell 124 and a single reference cell 128 one can store and read one bit of information and in some memory applications no more is required. Accordingly, it will be appreciated that a memory device is an embodiment with a low number of TCCT based memory cells 124 per reference cell 128 while an array 120 is an embodiment with a high number of TCCT based memory cells 124 per reference cell 128. Put another way, memory devices and memory arrays are simply convenient labels for opposite ends of a continuum.

An embodiment of the invention also includes a method for reading a state of a TCCT based memory cell within a memory device or a memory array 120. The method includes applying a first voltage to a TCCT based memory cell and a reference cell, connecting the TCCT based memory cell to a first bit line and connecting the reference cell to a second bit line, raising a memory voltage on the first bit line, raising on the second bit line a reference voltage that rises proportionally to the memory voltage, and sensing a difference between the memory voltage and the reference voltage. The first voltage can be applied to an anode of an NDR device of each of the TCCT based memory cell and the reference cell, preferably by a common line 136 (FIG. 11). Connecting the TCCT based memory cell to the first bit line and connecting the reference cell to the second bit line is preferably accomplished by activating a pass transistor in each cell.

Once the TCCT based memory cell is connected to the first bit line a memory voltage begins to rise on the first bit line, as described above. Similarly, once the reference cell is connected to the second bit line a reference voltage begins to rise on the second bit line. The reference cell has a gate-like device shorted to the anode of the NDR device and therefore the NDR device in combination with the pass transistor continuously acts as a TCCT based memory cell in the "on" state. Consequently, the reference cell produces the same voltage rise profile (FIG. 7) each time it is connected to the second bit line. However, the TCCT based memory cell can be in either the "on" or the "off" state when connected to the first bit line. Regardless of the state of the TCCT based memory cell, the voltage rise profile will be essentially the same and will be governed by equation (1), above, however the maximum voltage achieved is significantly different between the two; Ideally, the maximum voltage raised on the second bit line by the reference cell is half the difference between the maximum voltage raised on the first bit line by the TCCT based memory cell in the "on" and "off" states. However, since the maximum voltage raised on the first bit line by the TCCT based memory cell in the "off" state is negligible, the maximum voltage on the second bit line produced by the reference cell will be equal to about half of the maximum voltage raised on the first bit line by the TCCT based memory cell in the "on" state.

It will be appreciated that when a TCCT based memory cell is read and the memory and reference voltages are approaching their maximums, the memory voltage will either be above or below the reference voltage, depending on the state of the TCCT based memory cell. Further, as the memory and reference voltages approach their maximums a difference between the two voltages either increases to a positive maximum or decreases to a negative maximum, depending on the state of the TCCT based memory cell. Therefore, the state of the TCCT based memory cell can be determined by sensing the difference between the memory voltage and the reference voltage and determining the polarity thereof.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A reference cell for determining a state stored in a memory cell, comprising:
   a voltage source comprising a NDR device;
   a first resistive element coupled between the voltage source and a bit line and having a first resistance; and
   a second resistive element coupled between a sink and the bit line and having a second resistance.

2. The reference cell of claim 1 further including a gate-like device disposed adjacent to the NDR device and wherein the NDR device includes an anode and a cathode.

3. The reference cell of claim 2 wherein a word line connects the anode of the NDR device and the gate-like device.

4. A reference cell for determining a state stored in a memory cell, comprising:
   a voltage source comprising a SRAM memory cell;
   a first resistive element coupled between the voltage source and a bit line and having a first resistance; and
   a second resistive element coupled between a sink and the bit line and having a second resistance.

5. A reference cell for determining a state stored in a memory cell, comprising:
   a voltage source comprising a MRAM memory cell;
   a first resistive element coupled between the voltage source and a bit line and having a first resistance; and
   a second resistive element coupled between a sink and the bit line and having a second resistance.

6. A reference cell for determining a state stored in a memory cell, comprising:
   a voltage source comprising a memory cell with floating gate;
   a first resistive element coupled between the voltage source and a bit line and having a first resistance; and
   a second resistive element coupled between a sink and the bit line and having a second resistance.

7. A reference cell for determining a state stored in a memory cell, comprising:
   a voltage source;
   a first transistor coupled between the voltage source and a bit line and having a first resistance; and
   a second transistor coupled between a sink and the bit line and having a second resistance;
   wherein both the first and the second transistors include a gate coupled to a word line.

8. A reference cell for determining a state stored in a memory cell, comprising:
   a voltage source;
   a first resistive element coupled between the voltage source and a bit line and having a first resistance; and
   a second resistive element coupled between a sink and the bit line and having a second resistance;
   wherein the first resistive element includes two transistors coupled in series.

9. A reference cell for determining a state stored in a memory cell, comprising:
a voltage source;
a first resistive element coupled between the voltage source and a bit line and having a first resistance; and
a second resistive element coupled between a sink and the bit line and having a second resistance;
wherein the second resistive element includes two transistors coupled in series.

10. A memory device, comprising:
a memory cell configured to generate a first voltage on a first bit line and including a switching device having a first resistance;
a reference cell configured to generate a second voltage on a second bit line and including
a voltage source;
a first resistive element coupled between the voltage source and the second bit line and having a second resistance;
a second resistive element coupled between a sink and the second bit line and having a third resistance.

11. The memory device of claim 10 wherein the voltage source includes an NDR device.

12. The memory device of claim 11 wherein the reference cell further includes a gate-like device disposed adjacent to the NDR device.

13. The memory device of claim 12 wherein the reference cell further includes a first word line connecting the NDR device and the gate-like device.

14. The memory device of claim 10 further comprising means for comparing the first and second voltages.

15. The memory device of claim 10 further comprising a sense amplifier for comparing the first and second voltages.

16. The memory device of claim 10 wherein the second resistance is about twice the first resistance.

17. The memory device of claim 16 wherein the third resistance is about equal to the second resistance.

18. The memory device of claim 10 wherein the switching device is a pass transistor.

19. The memory device of claim 10 wherein memory cell is a TCCT based memory cell including an NDR device having a cathode coupled to the switching device.

20. The memory device of claim 10 wherein the first resistive element is a pass transistor.

21. The memory device of claim 20 wherein the second resistive element is a pull down transistor.

22. A memory array, comprising:
a plurality of memory cells, each memory cell configured to generate a first voltage on one of a plurality of bit lines and including a switching device having a first resistance;
a reference cell configured to generate a second voltage on another of the plurality of bit lines and including
a voltage source;
a first resistive element coupled between the voltage source and the another of the plurality of bit lines and having a second resistance;
a second resistive element coupled between a sink and the another of the plurality of bit lines and having a third resistance.

23. The memory array of claim 22 wherein the voltage source is an NDR device.

24. The memory array of claim 23 wherein the reference cell further includes a gate-like device disposed adjacent to the NDR device.

25. The memory array of claim 24 wherein the reference cell further includes a first word line connecting the NDR device and the gate-like device.

26. The memory array of claim 22 further comprising means for comparing the first and second voltages.

27. The memory array of claim 22 wherein the second resistance is about twice the first resistance.

28. The memory array of claim 27 wherein the third resistance is about equal to the second resistance.

29. The memory array of claim 22 wherein the plurality of memory cells are arranged in rows and wherein each memory cell on each row is coupled to one of said plurality of bit lines.

30. The memory array of claim 29 further comprising a plurality of reference cells.

31. The memory array of claim 30 wherein each of the plurality of reference cells is coupled to at least one of the plurality of bit lines.

32. The memory array of claim 31 wherein each of the plurality of bit lines is coupled to one of the plurality of reference cells.

33. The memory array of claim 32 further comprising a controller containing logic to select an individual memory cell connected to one of the plurality of bit lines and to select a reference cell on another one of the plurality of bit lines.

34. A method for reading a state of a memory cell, comprising:
applying a first voltage to the memory cell and a reference cell;
coupling the memory cell to a first bit line and connecting the reference cell to a second bit line;
raising a memory voltage on the first bit line;
raising on the second bit line a reference voltage that rises proportionally to the memory voltage; and
sensing a difference between the memory voltage and the reference voltage.

35. The method of claim 34 wherein the memory cell is a TCCT based memory cell.

36. The method of claim 35 wherein the state of the TCCT based memory cell is either on or off, and wherein the TCCT based memory cell in the on state can raise the memory voltage on the first bit line to maximum voltage, V.

37. The method of claim 36 wherein the reference cell can raise the reference voltage on the second bit line to maximum voltage equal to about half of V.

38. The method of claim 35 wherein the TCCT based memory cell includes a switch having a first resistance, R, the first bit line has a capacitance, C, and the reference voltage rises as a function of time, t, according to the relationship $(1-e^{-t/RC})$.

39. The method of claim 34 wherein sensing a difference between the memory voltage and the reference voltage includes determining a polarity of the difference.

* * * * *